(12) United States Patent
Fujimoto (10) Patent No.: US 11,812,606 B2
(45) Date of Patent: Nov. 7, 2023

(54) SEMICONDUCTOR DEVICE HAVING GATE TRENCH

(71) Applicant: MICRON TECHNOLOGY, INC., Boise, ID (US)

(72) Inventor: Toshiyasu Fujimoto, Higashihiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 175 days.

(21) Appl. No.: 17/193,985

(22) Filed: Mar. 5, 2021

(65) Prior Publication Data

US 2022/0285360 A1    Sep. 8, 2022

(51) Int. Cl.
*H10B 12/00* (2023.01)
*H01L 29/423* (2006.01)

(52) U.S. Cl.
CPC ......... *H10B 12/34* (2023.02); *H01L 29/4236* (2013.01); *H01L 29/42368* (2013.01); *H10B 12/053* (2023.02); *H10B 12/315* (2023.02)

(58) Field of Classification Search
None
See application file for complete search history.

(56) References Cited

U.S. PATENT DOCUMENTS

| | | | |
|---|---|---|---|
| 10,985,255 B2 * | 4/2021 | Huh | H01L 29/4236 |
| 2008/0081380 A1 * | 4/2008 | Celii | H01L 28/75 |
| | | | 257/E21.001 |
| 2010/0155799 A1 * | 6/2010 | Yokoyama | H01L 27/0207 |
| | | | 257/334 |
| 2014/0077294 A1 * | 3/2014 | Hwang | H01L 29/4983 |
| | | | 438/270 |
| 2018/0269211 A1 * | 9/2018 | Kim | H01L 27/10852 |
| 2022/0285360 A1 * | 9/2022 | Fujimoto | H01L 27/10823 |

* cited by examiner

*Primary Examiner* — Hsien Ming Lee
(74) *Attorney, Agent, or Firm* — Dorsey & Whitney LLP (57) ABSTRACT

Disclosed herein is a method that includes forming a gate trench in a semiconductor substrate, forming a gate insulating film on an inner wall of the gate trench, forming a gate electrode in the gate trench via the gate insulating film, ashing a top surface of the gate electrode to form a first insulating film, and forming a gate cap insulating film embedded in the gate trench to cover the first insulating film.

17 Claims, 9 Drawing Sheets

SEMICONDUCTOR DEVICE HAVING GATE TRENCH

BACKGROUND

There is a case where a gate electrode of a memory cell transistor used in a DRAM is embedded in a gate trench formed in a semiconductor substrate. In recent years, there is a case where a hybrid gate structure is employed, which reduces GIDL (Gate-Induced Drain Leakage) by using a conductive material having a small work function as an upper portion of the gate electrode that is embedded in the gate trench. However, in the hybrid gate structure, it is difficult to form the top surface of the gate electrode to be flat, and there is a tendency that the height of the top surface of the gate electrode becomes higher toward the inner wall of the gate trench. Such a shape of the top surface of the gate electrode reduces a short margin with respect to a bit contact plug, and increases the floating capacitance between a bit line and a word line.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
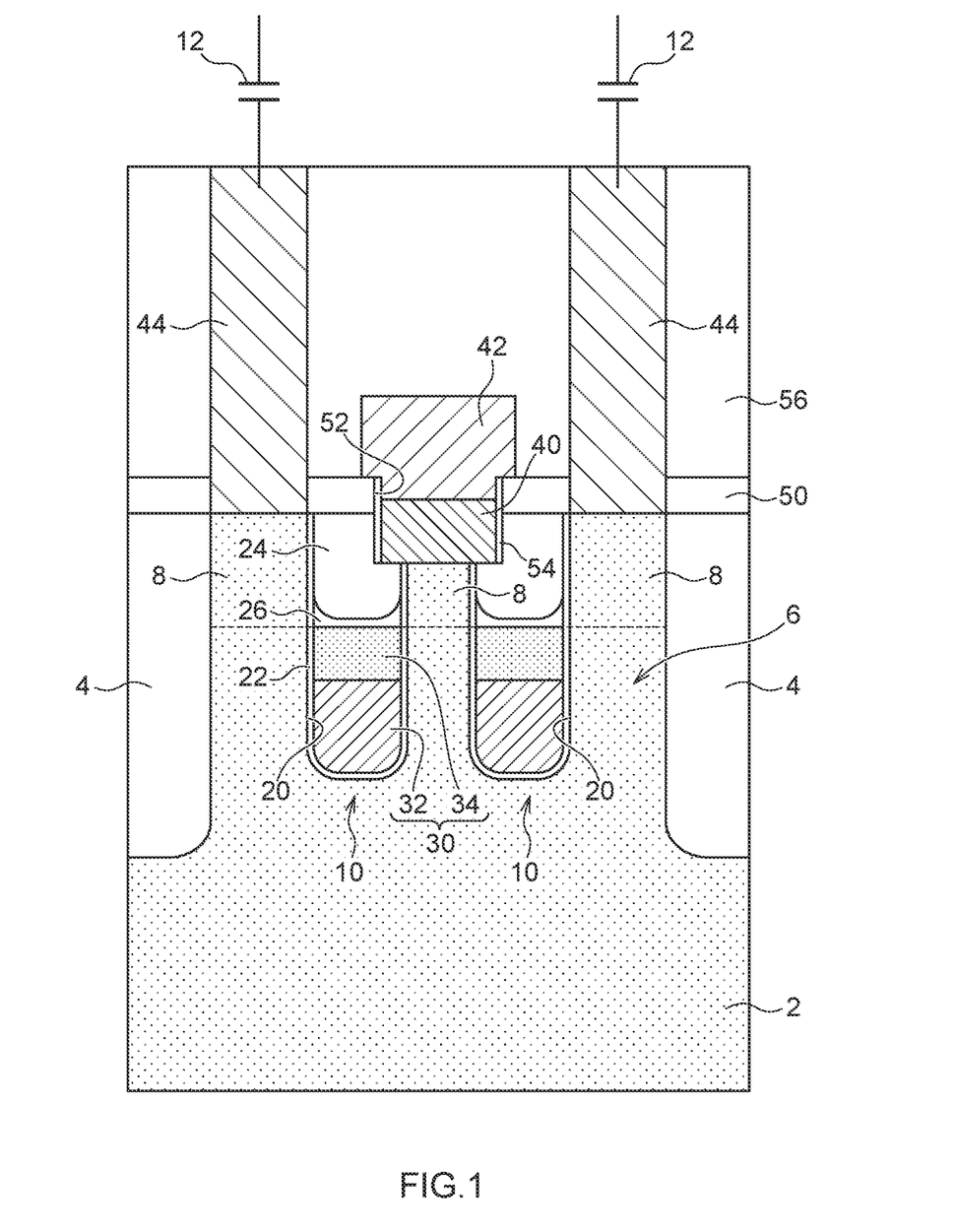
FIG. 1 is a schematic cross-section of a semiconductor device according to the present disclosure.

A semiconductor device according to the present disclosure is a semiconductor memory device such as a DRAM and includes a memory cell transistor 10 and a cell capacitor 12 as shown in FIG. 1. The memory cell transistor 10 is formed in an active region 6 of a silicon substrate 2 which is divided by an STI region 4. The active region 6 is made of p-type monocrystalline silicon. Two gate trenches 20 are provided in the active region 6. The inner wall of each gate trench 20 is covered by a gate insulating film 22 made of silicon oxide. A gate electrode 30 is embedded in the gate trench 20 via the gate insulating film 22. The gate electrode 30 includes a lower gate electrode 32 located in a lower portion of the gate trench 20 and an upper gate electrode 34 located on the lower gate electrode 32. The lower gate electrode 32 is made of a conductive material having a large work function such as titanium nitride or tungsten. The upper gate electrode 34 is made of a conductive material that has a work function smaller than that of the lower gate electrode 32, such as polycrystalline silicon. An upper portion of the gate electrode 30 is covered by a gate cap insulating film 24 made of a material such as silicon nitride. Further, an insulating film 26 made of a material such as silicon oxide is located between the gate electrode 30 and the gate cap insulating film 24. As shown in FIG. 1, while the top surface of the gate electrode 30 is substantially flat, the height of the top surface of the insulating film 26 becomes higher toward the inner wall of the gate trench 20. That is, the thickness of the insulating film 26 becomes thicker toward the inner wall of the gate trench 20. In other words, the insulating film 26 includes an edge portion thicker than a center portion. A buried word line includes gate insulating film 22, gate electrode 30, insulating film 26, and gate cap insulating film 24. Thus, FIG. 1 shows two buried word lines, which extend in parallel over the active region 6.

The two buried word lines divide the active region 6 into first, second, and third active regions. Regions in the active region 6, which are at a level higher than the gate electrode 30, serve as a pair of source/drain regions 8. The pair of source/drain regions 8 are made of n-type monocrystalline silicon and are located to sandwich the gate trench 20. One of the source/drain regions 8 is connected to a bit line 42 via a bit contact plug 40, and the other of the source/drain regions 8 is connected to the cell capacitor 12 via a cell contact 44. The bit contact plug 40 is embedded in a trench 52 provided in an insulating film 50 covering the active region 6. The bottom of the trench 52 reaches the active region 6 and the gate cap insulating film 24, so that a part of the bit contact plug 40 is embedded in the active region 6 and the gate trench 20. A part of the bit contact plug 40 overlaps the gate electrode 30. The inner wall of the trench 52 is covered by a side-wall insulating film 54. The insulating film 50 is further covered by an insulating film 56. The cell contact 44 is embedded in the insulating film 56.

Next, a manufacturing method of a semiconductor device according to the present embodiment is described.

Figure 2A:
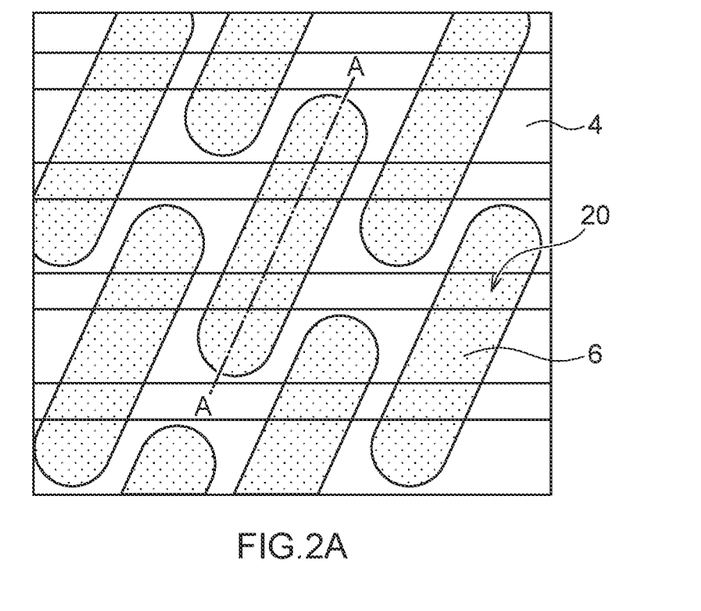
FIG. 2A is a partial schematic plan view for explaining a manufacturing process of the semiconductor device according to the present disclosure.
Figure 2B:
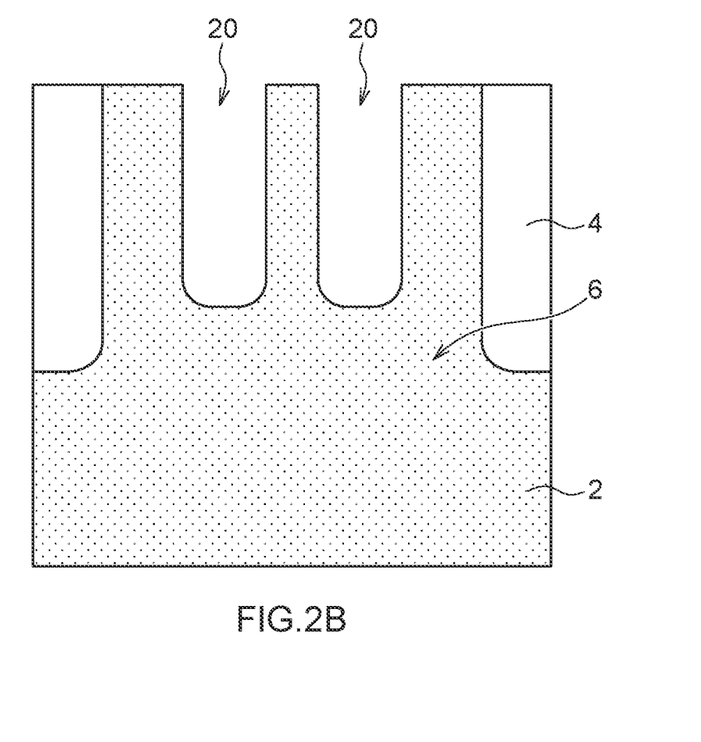
FIG. 2B is a schematic cross-section along a line A-A shown in FIG. 2A.
Figure 3A:
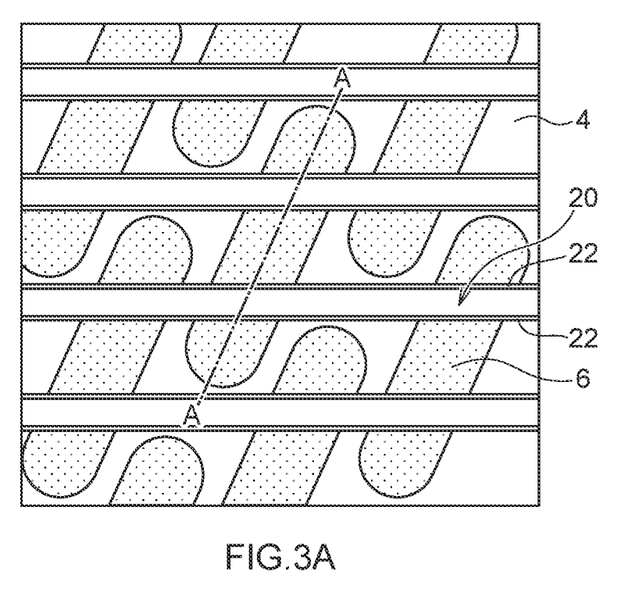
FIG. 3A is a partial schematic plan view for explaining a manufacturing process of the semiconductor device according to the present disclosure.
Figure 3B:
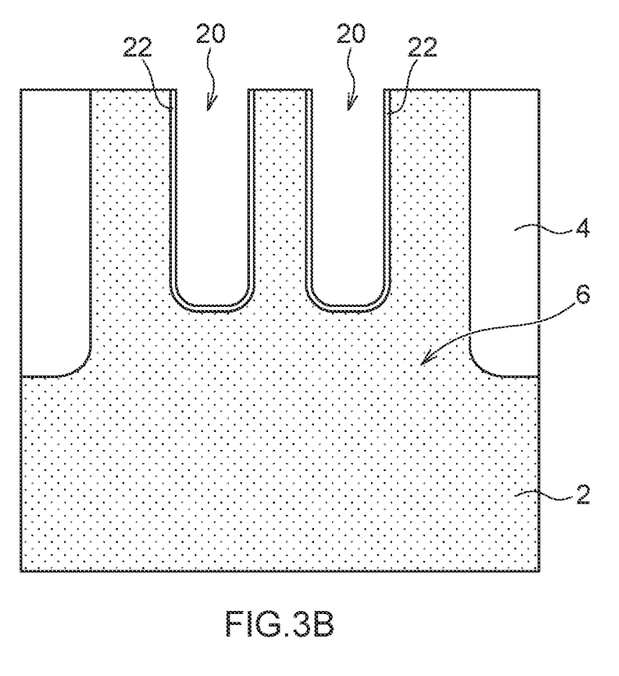
FIG. 3B is a schematic cross-section along a line A-A shown in FIG. 3A.
Figure 4A:
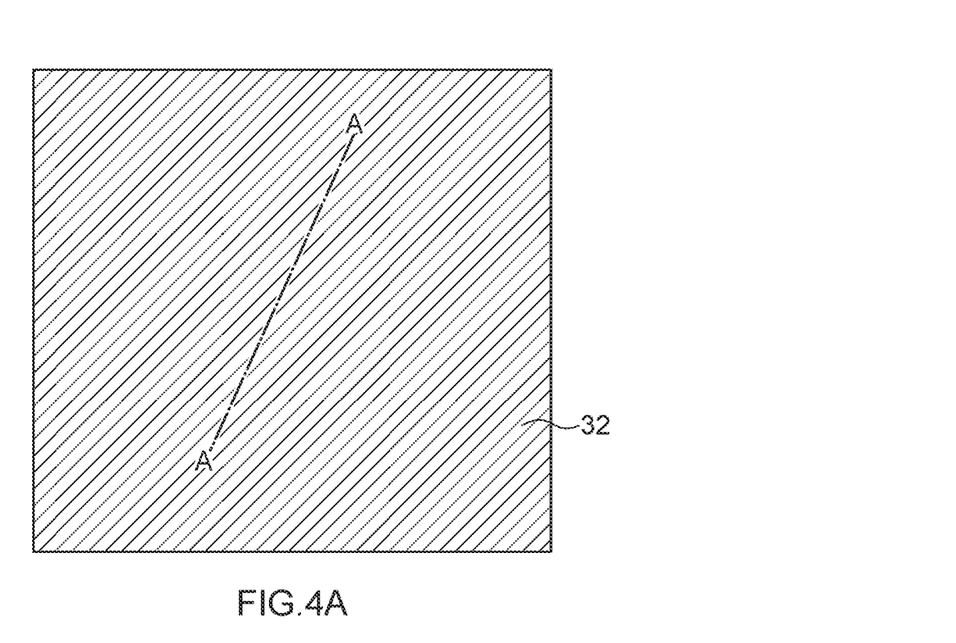
FIG. 4A is a partial schematic plan view for explaining a manufacturing process of the semiconductor device according to the present disclosure.
Figure 4B:
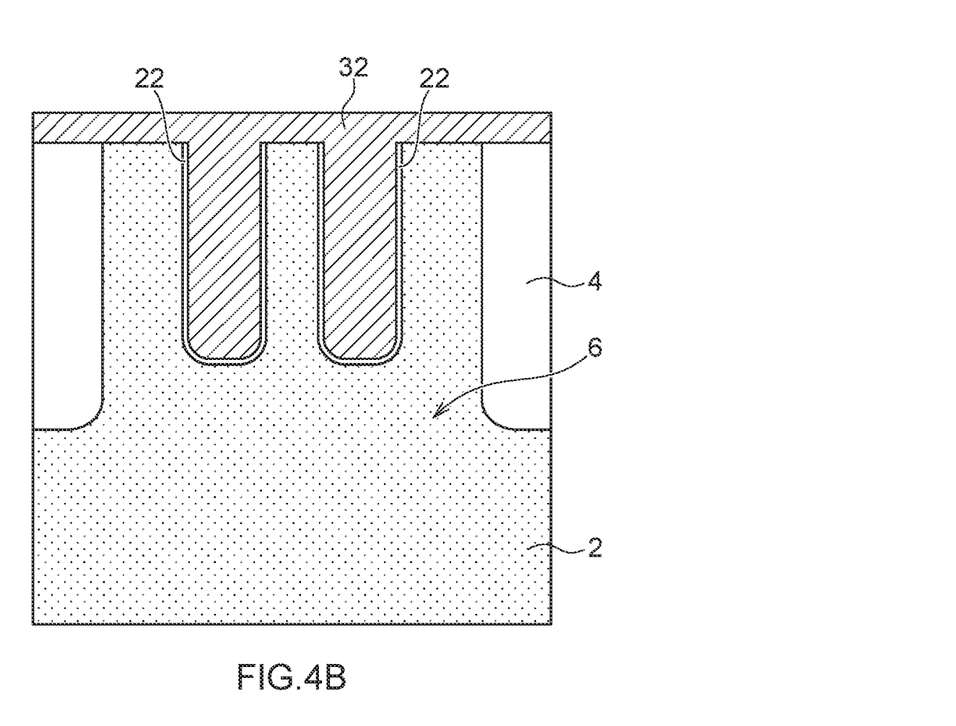
FIG. 4B is a schematic cross-section along a line A-A shown in FIG. 4A.
Figure 5A:
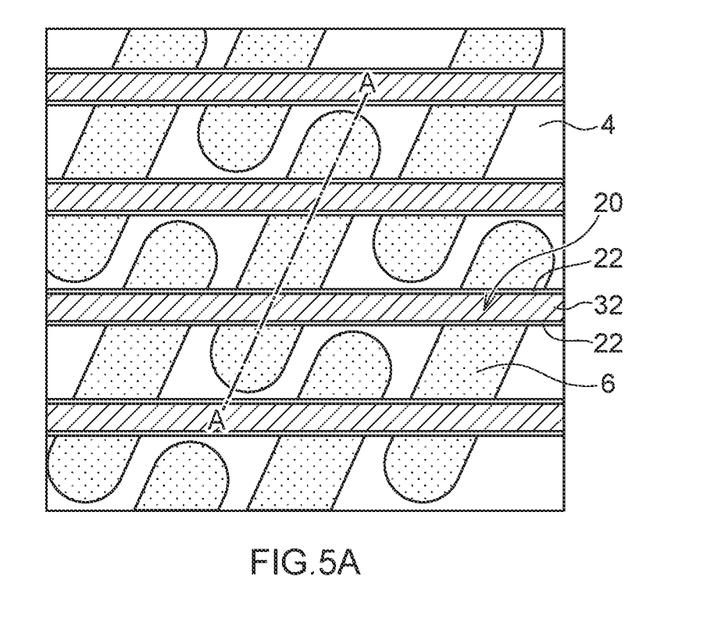
FIG. 5A is a partial schematic plan view for explaining a manufacturing process of the semiconductor device according to the present disclosure.
Figure 5B:
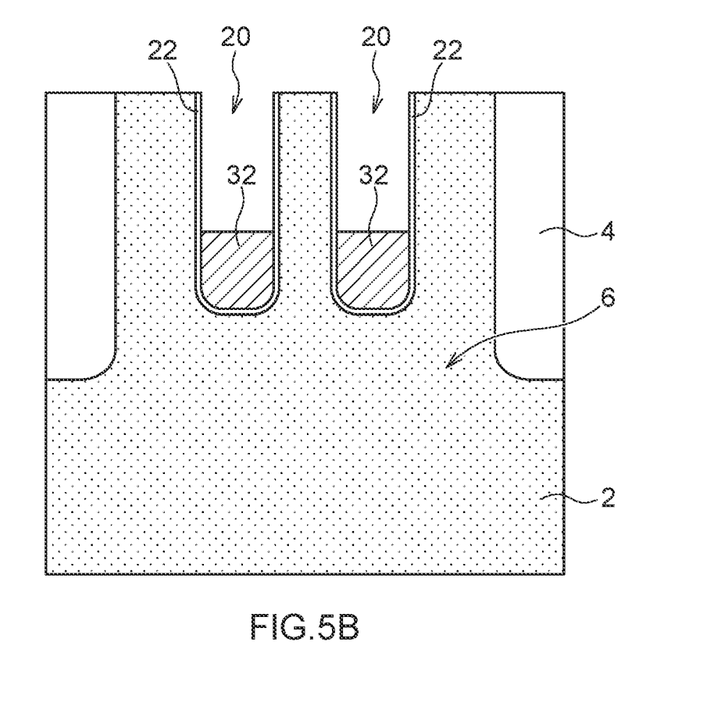
FIG. 5B is a schematic cross-section along a line A-A shown in FIG. 5A.
Figure 6A:
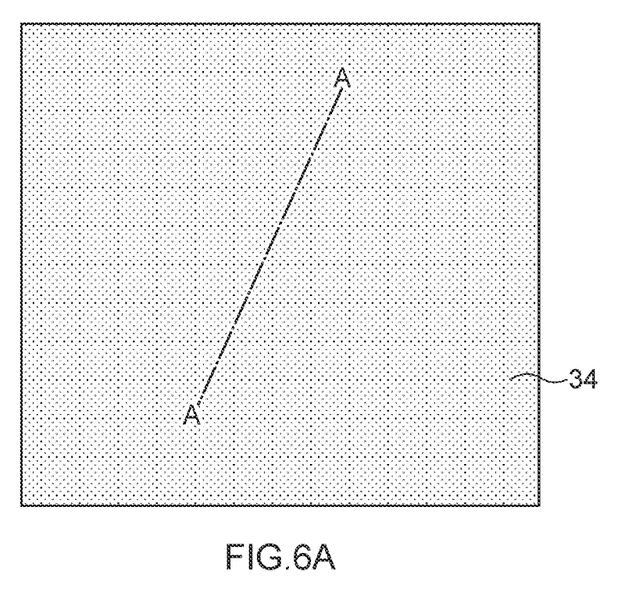
FIG. 6A is a partial schematic plan view for explaining a manufacturing process of the semiconductor device according to the present disclosure.
Figure 6B:
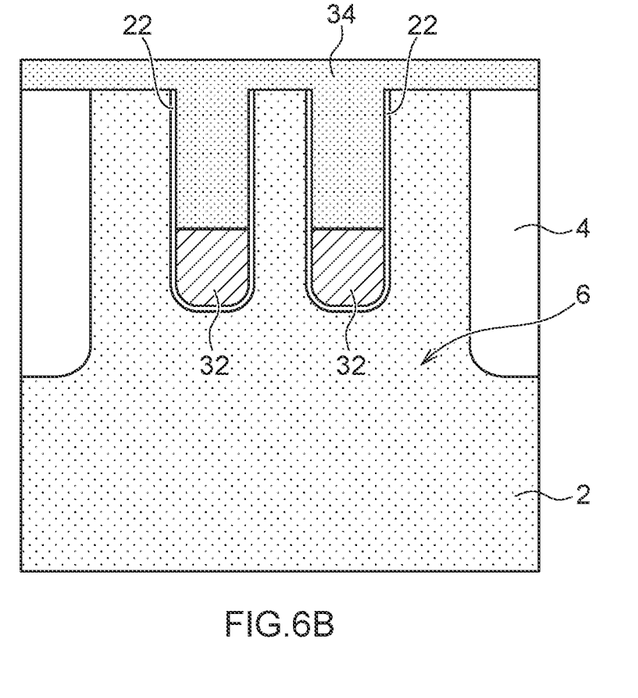
FIG. 6B is a schematic cross-section along a line A-A shown in FIG. 6A.
Figure 7A:
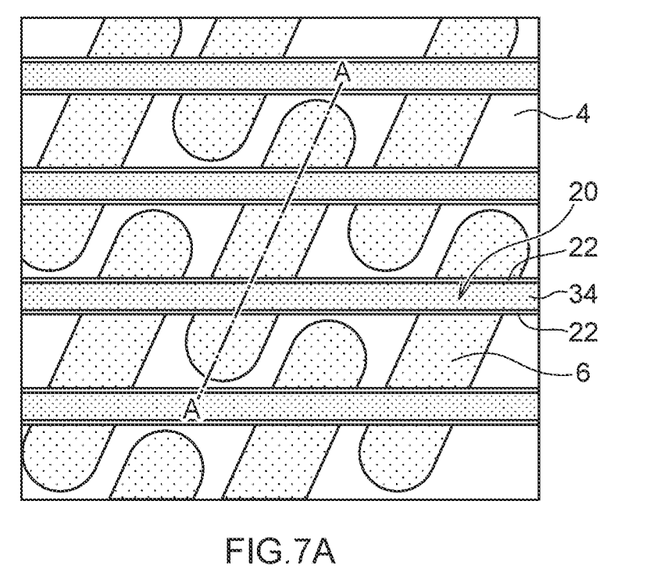
FIG. 7A is a partial schematic plan view for explaining a manufacturing process of the semiconductor device according to the present disclosure.
Figure 7B:
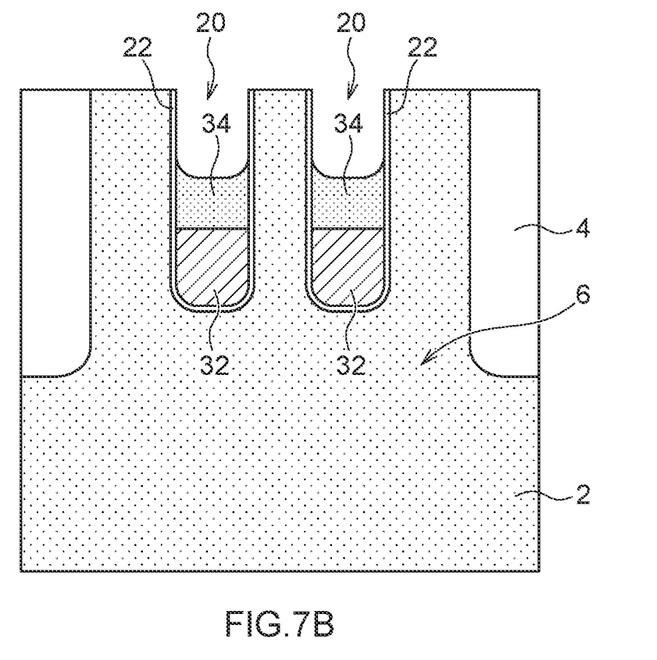
FIG. 7B is a schematic cross-section along a line A-A shown in FIG. 7A.

First, the STI region 4 is formed in the silicon substrate 2, as shown in FIGS. 2A and 2B. A region surrounded by the STI region 4 is the active region 6. Next, the gate trenches 20 are formed in the silicon substrate 2 and the STI region 4. Two of the gate trenches 20 are assigned to one active region 6. Next, as shown in FIGS. 3A and 3B, the gate insulating film 22 is formed on the inner wall of each gate trench 20 by thermal oxidation. Next, as shown in FIGS. 4A and 4B, the lower gate electrode 32 made of a material such as titanium nitride or tungsten is deposited on the entire surface, thereby embedding the gate trenches 20 with the lower gate electrode 32. The lower gate electrode 32 is then etched back, as shown in FIGS. 5A and 5B. Consequently, the lower gate electrode 32 is left at the bottom of each gate trench 20. Next, as shown in FIGS. 6A and 6B, the upper gate electrode 34 made of a material such as polycrystalline silicon is deposited on the entire surface, thereby embedding the gate trenches 20 with the upper gate electrode 34. The upper gate electrode 34 is then etched back, as shown in FIGS. 7A and 7B. Consequently, the upper gate electrode 34 is left on the lower gate electrode 32 in each gate trench 20. At this time, the top surface of the upper gate electrode 34 is not flat, but the height of the top surface becomes higher toward the inner wall of the gate trench 20. That is, the thickness of the upper gate electrode 34 becomes thicker toward the inner wall of the gate trench 20. This is because the film density of the upper gate electrode 34 is lower near the center of the gate trench 20 than near the inner wall of the gate trench 20 and therefore the etching rate inevitably becomes higher near the center of the gate trench 20 than near the inner wall of the gate trench 20. For this reason, the top surface of the upper gate electrode 34 is substantially U-shaped.

Figure 8A:
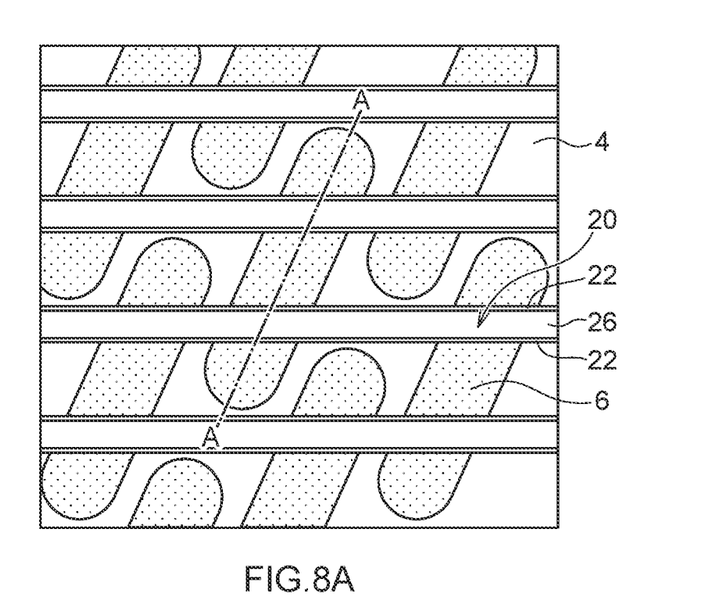
FIG. 8A is a partial schematic plan view for explaining a manufacturing process of the semiconductor device according to the present disclosure.
Figure 8B:
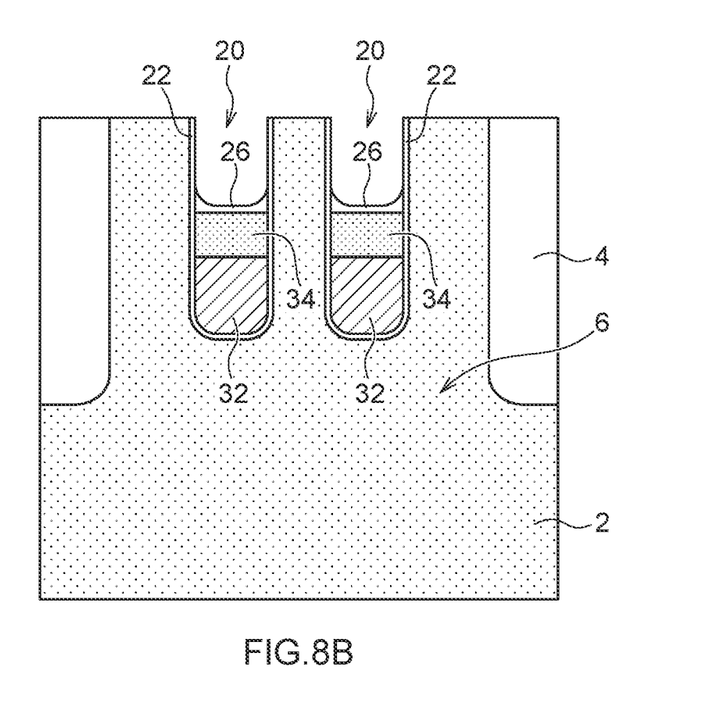
FIG. 8B is a schematic cross-section along a line A-A shown in FIG. 8A.
Figure 9A:
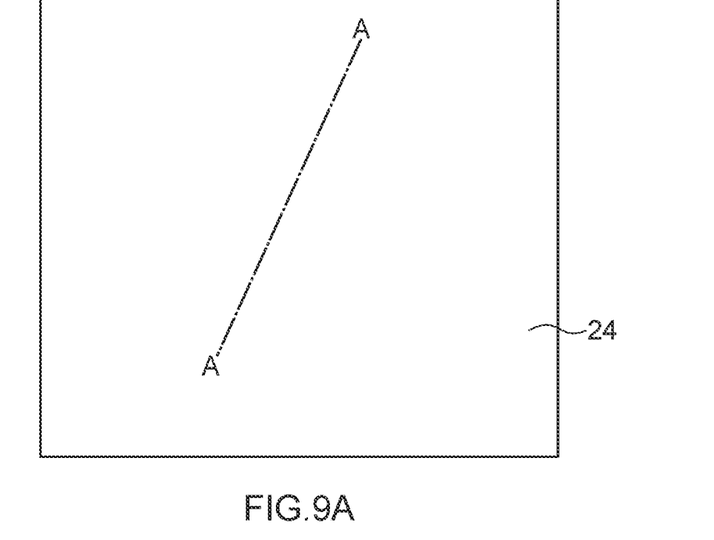
FIG. 9A is a partial schematic plan view for explaining a manufacturing process of the semiconductor device according to the present disclosure.
Figure 9B:
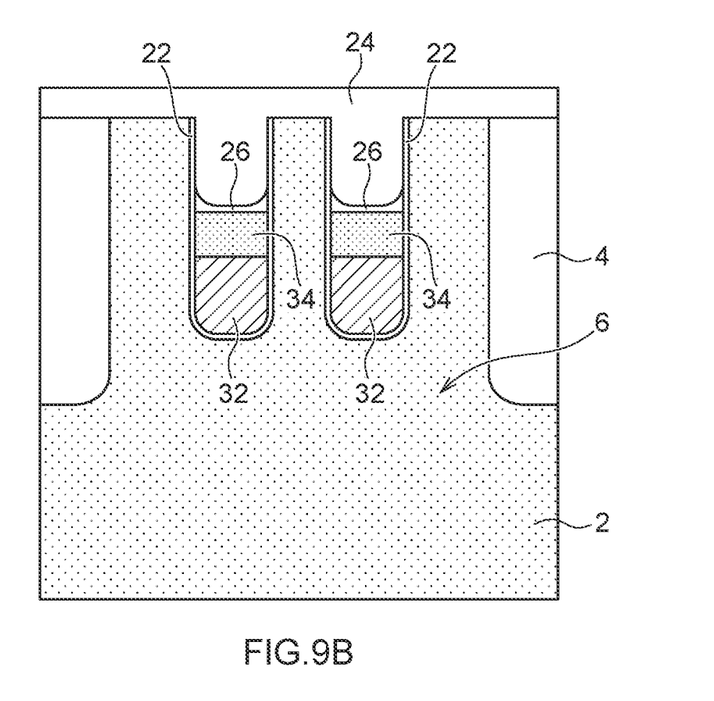
FIG. 9B is a schematic cross-section along a line A-A shown in FIG. 9A.

Next, as shown in FIGS. 8A and 8B, the surface layer of the upper gate electrode 34 is oxidized by ashing. Ashing of the upper gate electrode 34 can be performed in situ after formation of the upper gate electrode 34. Accordingly, about 2-mm-thick surface layer of the upper gate electrode 34 turns into the insulating film 26 made of silicon oxide. As a result, the substantially U-shaped top surface of the upper gate electrode 34 is made substantially flat. Next, as shown in FIGS. 9A and 9B, the gate cap insulating film 24 made of a material such as silicon nitride is formed on the entire surface, thereby embedding the gate trenches 20 with the gate cap insulating film 24. The trench 52 is then formed to reach the active region 6 and the gate cap insulating film 24, as shown in FIG. 1, and thereafter the bit contact plug 40 is formed in the trench 52. At this time, although a part of the bit contact plug 40 overlaps the gate electrode 30, the short margin of the bit contact plug 40 with respect to the gate electrode 30 increases because the surface layer of the upper gate electrode 34 has been subjected to ashing and has turned into the insulating film 26 made of silicon oxide. Further, since the insulating film 26 made of silicon oxide has a permittivity lower than the gate cap insulating film 24 made of silicon nitride, the floating capacitance between a bit line and a word line is also reduced.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a semiconductor substrate having a gate trench;
   a gate insulating film covering an inner wall of the gate trench;
   a gate electrode embedded in the gate trench via the gate insulating film;
   a gate cap insulating film embedded in the gate trench to cover a top surface of the gate electrode;
   a first insulating film located between the top surface of the gate electrode and the gate cap insulating film, wherein the first insulating film comprises a different insulating material from the gate cap insulating film, wherein the top surface of the gate electrode is substantially flat, and wherein the first insulating film includes an edge portion thicker than a center portion thereof;
   a pair of source/drain regions formed in the semiconductor substrate and located to sandwich the gate trench; and,
   a bit line coupled to one of the source/drain regions; and
   a bit contact plug coupled between the one of the source/drain regions and the bit line,
   wherein at least a part of the bit contact plug is embedded in the gate cap insulating film embedded in the semiconductor substrate such that a portion of the bit contact plug is embedded in the gate trench and overlaps with the gate electrode.

2. The apparatus of claim 1,
   wherein the gate electrode includes a first gate electrode located at a bottom of the gate trench and a second gate electrode located on the first gate electrode, and
   wherein the second gate electrode comprises a different conductive material from the first gate electrode.

3. The apparatus of claim 2, wherein the first gate electrode comprises titanium nitride or tungsten.

4. The apparatus of claim 2, wherein the second gate electrode comprises polycrystalline silicon.

5. The apparatus of claim 4, wherein the first insulating film comprises silicon oxide.

6. The apparatus of claim 5, wherein the gate cap insulating film comprises silicon nitride.

7. The apparatus of claim 1, further comprising:
   a cell capacitor coupled to the other of the source/drain regions.

8. A method comprising:
   forming a gate trench and a pair of source/drain regions in a semiconductor substrate, wherein the pair of source/drain regions is located to sandwich the gate trench;
   coupling a bit line to one of the source/drain regions;
   coupling a bit contact plug between one of the source/drain regions and the bit line;
   covering an inner wall of the gate trench with a gate insulating film;
   filling a lower portion of the gate trench, of which the inner wall is covered with the gate insulating film, with a gate electrode;
   ashing a top surface of the gate electrode to form a first insulating film, wherein the top surface of the gate electrode is substantially flat, and wherein the first insulating film includes an edge portion thicker than a center portion thereof; and forming a gate cap insulating film embedded in an upper portion of the gate trench to cover the first insulating film, wherein at least a part of the bit contact plug is embedded in the gate cap insulating film such that a portion of the bit contact plug is embedded in the gate trench and overlaps with the gate electrode.

9. The method of claim 8, wherein the forming the gate electrode comprising:

forming a first gate electrode in a bottom of the gate trench; and forming a second gate electrode on the first gate electrode, wherein the second gate electrode comprises a different conductive material from the first gate electrode.

10. The method of claim 9, wherein the first gate electrode comprises titanium nitride or tungsten.

11. The method of claim 10, wherein the second gate electrode comprises polycrystalline silicon.

12. The method of claim 11, wherein the gate cap insulating film comprises silicon nitride.

13. The method of claim 8, wherein the ashing of the top surface of the gate electrode comprises turning a 2 mm thick surface layer of the top surface of the gate electrode into the first insulating film.

14. An apparatus comprising:

a semiconductor substrate comprising an active region; and two buried word lines extending in parallel over the active region to divide the active region into first, second and third active regions;

wherein each of the two buried word lines comprises:

a gate insulating film covers an inner wall of a gate trench;

a gate electrode embedded in a lower portion of the gate trench of which the inner wall is covered with the gate insulating film;

a gate cap insulating film filling an upper portion of the gate trench of which the inner wall is covered with the gate insulating film;

a first insulating film between the gate electrode and the gate cap insulating film, wherein the first insulating film comprises a different insulating material from the gate cap insulating film, wherein the top surface of the gate electrode is substantially flat, and wherein the first insulating film includes an edge portion thicker than a center portion thereof;

a pair of source/drain regions formed in the semiconductor substrate and located to sandwich the gate trench; and, a bit line coupled to one of the source/drain regions; and a bit contact plug coupled between the one of the source/drain regions and the bit line, wherein at least a part of the bit contact plug is embedded in the gate cap insulating film embedded in the semiconductor substrate such that a portion of the bit contact plug is embedded in the gate trench and overlaps with the gate electrode.

15. The apparatus of claim 14, wherein the gate electrode includes a first gate electrode located at a bottom of the gate trench and a second gate electrode located on the first gate electrode, and wherein the second gate electrode comprises a different conductive material from the first gate electrode.

16. The apparatus of claim 15, wherein the second gate electrode comprises polycrystalline silicon.

17. The apparatus of claim 16, wherein the first insulating film comprises silicon oxide.

* * * * *